United States Patent
Setzer

(10) Patent No.: US 6,486,602 B1
(45) Date of Patent: Nov. 26, 2002

(54) HIGH-PRESSURE DISCHARGE LAMP ELECTRODE HAVING A DENDRITIC SURFACE LAYER THEREON

(75) Inventor: Carsten Setzer, Berlin (DE)

(73) Assignee: Patent-Treuhand-Gesellschaft fuer elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/508,167
(22) PCT Filed: Feb. 10, 1999
(86) PCT No.: PCT/DE99/00372
   § 371 (c)(1),
   (2), (4) Date: Mar. 8, 2000
(87) PCT Pub. No.: WO00/08672
   PCT Pub. Date: Feb. 17, 2000

(30) Foreign Application Priority Data

Aug. 6, 1998 (DE) .......................... 198 35 476

(51) Int. Cl.[7] .............................................. H01J 35/08
(52) U.S. Cl. .......................... 313/633; 313/330; 313/40; 313/351

(58) Field of Search ................................ 313/633, 631, 313/623, 628, 567; 427/436; 429/218

(56) References Cited

U.S. PATENT DOCUMENTS

| | | | |
|---|---|---|---|
| 3,982,148 A | | 9/1976 | Kaplan et al. |
| 4,690,840 A | * | 9/1987 | Gauthier et al. ............. 427/436 |
| 5,021,711 A | * | 6/1991 | Madden et al. ............. 313/623 |
| 5,789,863 A | * | 8/1998 | Takahashi et al. .......... 313/623 |
| 6,060,829 A | * | 5/2000 | Kubon et al. ............... 313/631 |
| 6,169,365 B1 | * | 1/2001 | Kubon et al. ............... 313/631 |

FOREIGN PATENT DOCUMENTS

| | | |
|---|---|---|
| DE | 1182743 | 12/1964 |
| DE | 4229317 | 3/1994 |
| EP | 0791950 | 8/1976 |

* cited by examiner

*Primary Examiner*—Vip Patel
*Assistant Examiner*—Ken A Berck
(74) *Attorney, Agent, or Firm*—William H. McNeill

(57) ABSTRACT

In the case of an electrode (5) for a high-pressure discharge lamp, at least a part of the surface of the electrode is covered with a dendritic layer (13) made from high-melting-point metal. A substantially longer service life is achieved thereby.

9 Claims, 6 Drawing Sheets

HIGH-PRESSURE DISCHARGE LAMP ELECTRODE HAVING A DENDRITIC SURFACE LAYER THEREON

TECHNICAL FIELD

The invention proceeds from an electrode for a high-pressure discharge lamp in accordance with the preamble of claim 1. At issue, in particular, are mercury short-arc lamps, in particular for the semiconductor industry. There, they are frequently used in photolithographic processes for exposing wafers or other substrates. A further preferred field of application is inert gas high-pressure discharge lamps, in particular xenon high-pressure discharge lamps. Application for metal halide lamps is also possible.

PRIOR ART

Already known from publication EP-A 791 950 is a high-pressure discharge lamp in which the anode is provided outside its tip with a sintered-on layer made from fine-grained tungsten. The surface of the anode is enlarged thereby. The temperature of the anode can thus be lowered during operation, and the bulb blackening can be reduced. The emissivity of such a layer is approximately 0.5.

DE-A 11 82 743 discloses the use of a layer which raises the emissivity and is made from sintered-on tungsten or TaC. The layer is applied to the anode in this case by slurrying a suspension of butyl acetate with cellulose binder and the corresponding metal powder. The sintering process is performed under a vacuum at temperatures above 1800° C. Additional cooling can be achieved by using cooling channels 1–3 mm deep.

SUMMARY OF THE INVENTION

It is the object of the present invention to provide an electrode for a high-pressure discharge lamp in accordance with the preamble of claim 1 which has a very long service life.

This object is achieved by means of the characterizing features of claim 1. Particularly advantageous refinements are to be found in the dependent claims.

The coating according to the invention of the surface of an electrode is suitable as an extremely effective mechanism for cooling the electrode (by thermal radiation). The point is that the higher the emission coefficient the cooler the electrode becomes. Consequently, the tungsten evaporation from the electrode, and thus the bulb blackening can be reduced. Because of the exponential increase in the tungsten evaporation rate with the temperature of the electrode, even a comparatively slight drop in temperature leads to a substantial reduction in the bulb blackening.

In photolithography, in particular, it is required of the lamp that the reduction in the luminous flux should be as slight as possible in the course of the lamp operation. An alternative is the desire for a luminous flux which is as high as possible, so that it is possible to achieve a very short exposure time of the substrate. Consequently, a lengthening of the service life can be achieved, on the one hand. Alternatively, design possibilities are opened up for achieving a higher initial intensity in conjunction with constant maintenance. The dimensions of the electrodes can also possibly be reduced.

The reason for the reduction in the luminous flux is that the electrode material (tungsten being used as a rule) can melt and evaporate in the discharge arc in the case of a high power density. The anode, in particular, is heated up strongly by the impact of the electrons. Tungsten evaporating from the anode is deposited on the bulb and leads to bulb blackening which reduces the luminous flux of the lamp. However, the invention can also be applied in the case of highly loaded cathodes.

The anode temperature depends in this case essentially on the power emitted by it. If the anode is regarded as a Planckian radiator, the emitted power per area (L) is described by the Stefan-Boltzmann law:

$$L = \epsilon \times \sigma \times T^4$$

Here, $\sigma = 5.67 \times 10^{-8}$ W m$^{-2}$ K$^{-4}$ is the Stefan-Boltzmann constant; the emission coefficient $\epsilon$ describes the deviation of a thermal radiator ($0 < \epsilon < 1$) from an ideal blackbody radiator. ($\epsilon = 1$). T is the temperature in K.

In the present invention, the coating of the anode with a dendritic metal or a metal compound increases the emission coefficient from approximately 0.3 (pure tungsten) to values above 0.6 (in the case of a temperature of at least 1000° C.). Values of over 0.8 are even reached for the first time in lamp construction. The dendritic structure is understood here as a multiplicity of needle-shaped, radiation-reflecting outgrowths on the otherwise smooth surface. These outgrowths are located next to one another at a spacing of a few nanometers to more than a hundred micrometers, preferably at a mean spacing of at least 300 nm. A structure in which the depth of the valley between two neighbouring needle-shaped peaks is at least 30% of the spacing of these peaks from one another has proved to be particularly suitable. The dendritic layer can be produced, in principle, from high-melting-point metals. Particularly suitable are rhenium, tungsten, molybdenum and tantalum or their carbides and/or nitrides. Carbides or nitrides of hafnium or zirconium are also suitable. In addition, a normal coating made from a high-melting-point metal can be applied between the core of tungsten and the dendritic layer.

A rhenium layer is particularly suitable, since a dendritic structure can be produced particularly effectively thereby. Its emission coefficient $\epsilon$ is approximately 0.9. Consequently, for a prescribed emitted power L it is possible in the case of an anode coated with dendritic rhenium to reduce the temperature by up to 200 K when operating the anode, by comparison with an uncoated anode, or one coated with sintered-on tungsten or TaC. The suitability of the rhenium layer for lamp construction is astonishing to the extent that the vapour pressure of the rhenium is higher by a factor of approximately 75 by comparison with tungsten. This point of view plays no role in the case of a rotary anode operated in a vacuum, since the vapour-deposited material condenses at cold spots. However, in lamp construction the intense deposition would lead to blackening, and thus to reduced service life. Because of the substantial temperature drop, this disadvantageous effect is more than balanced out, however.

This greatly improved anode cooling furthermore greatly reduces the evaporation of the regular electrode material (tungsten) from the deposition surface of the anode facing the discharge. As a consequence thereof, the lamp is distinguished overall in the case of identical light data by a substantially diminished reduction in radiation in the course of the service life.

The front region of the anode is preferably hemispherical or conically tapered. Particularly suitable is a conical frustum with a plane deposition surface for the discharge (called the anode plateau in the following text).

Alternatively, the invention can provide anodes with smaller dimensions in conjunction with an unchanged service life response and the same operating temperature. The smaller dimensioning reduces the shading of the discharge arc by the electrodes, as a result of which the luminous flux of the lamp is increased in conjunction with the same service life response.

For example, it is possible by means of chemical gas phase epitaxy (also known in technical language as CVD (Chemical Vapor Deposition)) to apply to the surface of the anode a metal layer, approximately 10 to 40 µm thick, with a dendritic surface morphology. It is characterized by needle-shaped crystallites whose mutual spacing is typically approximately 10–30 µm. The needle-shaped crystallites are positioned approximately perpendicularly on the surface, with the result that incident radiation is virtually completely absorbed by multiple reflection between the lateral surfaces of neighbouring crystals. As a result, such a layer has a high absorptivity and is black. In accordance with the high absorptivity, it has a high emission coefficient of up to $\epsilon=0.9$. The production of such layers is described in U.S. Pat. No. 3,982,148 in connection with an application in rotary anodes for X-ray tubes. Reference is expressly made to this publication. The CVD technique is particularly suitable as a method of production for this layer. However, other techniques for the production of thin, high-melting-point, metal layers such as, for example, sputtering (often designated in technical language as PVD (Physical Vapor Deposition)) or laser ablation also come into consideration.

The increase in the emission coefficient to values of up to approximately 0.9 can lower the temperature of the anode plateau, principally in high-pressure short arc lamps, by up to 200 K by comparison with uncoated anodes.

The present invention is suitable chiefly for mercury high-pressure discharge lamps with a content of 1 to 60 mg/cm³ Hg. A typical cold filling pressure of the added inert gas is from 0.2 to 5 bar. Xenon is used, in particular, but argon (250 mbar) is also very suitable.

The present invention can also be applied to other types of lamp, in particular to xenon high-pressure discharge lamps with a cold filling pressure of up to 20 bar. A very important field of application are high-pressure discharge lamps which are operated in a pulse fashion or with direct current. The point is that the loading of the electrode is particularly high here. To date, the anode plateau has melted in the middle and exhibited an extensive change in structure. This a problem has now been eliminated. In principle, the technique described here is suitable not only for the anodes of this highly loaded lamp, but also for its cathodes. The front region of the cathode is advantageously pointed.

FIGURES

The invention is to be explained in more detail below with the aid of a plurality of exemplary embodiments. In the drawing:

FIG. 1 shows a mercury high-pressure discharge lamp,

FIG. 2 shows the coated anode of the lamp from FIG. 1,

FIG. 3 shows a comparison of the anode temperature of two lamps,

FIG. 4 shows a further exemplary embodiment of a coated cathode,

FIG. 5 shows a further exemplary embodiment of a coated cathode,

FIG. 6 shows a comparison between the reduction in radiation of two lamps in constant operation, FIG. 7 shows a comparison between the reduction in radiation of two lamps in pulsed operation, and FIG. 8 shows the pulse shape for operation of the lamps in FIG. 7.

In another exemplary embodiment of lower power (below 1000 W), the entire anode is coated with rhenium.

Figure 3:
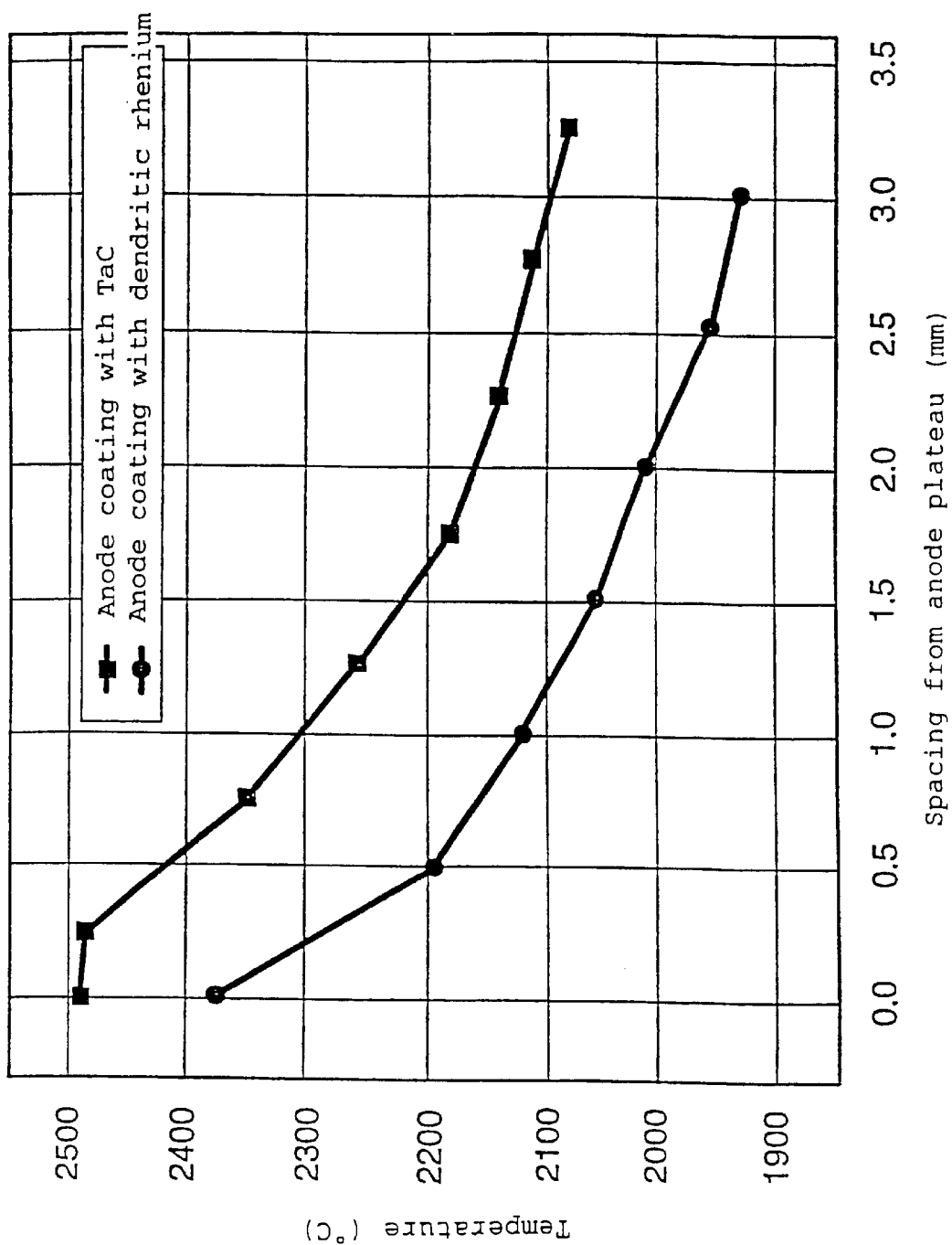

FIG. 3 shows a comparison of the temperature in the region of the anode plateau and of the cylinder for a mercury short-arc lamp with a power of 3500 W between an anode coated with dendritic rhenium and an anode coated with TaC. The anode plateau is the part of the anode most strongly loaded thermally, from which the tungsten leading to bulb blackening evaporates. The temperature difference between the two versions is approximately 170° C. on the plateau. This difference is maintained over the entire front region of the anode (up to a spacing of at least 3 mm from the plateau).

Figure 1:
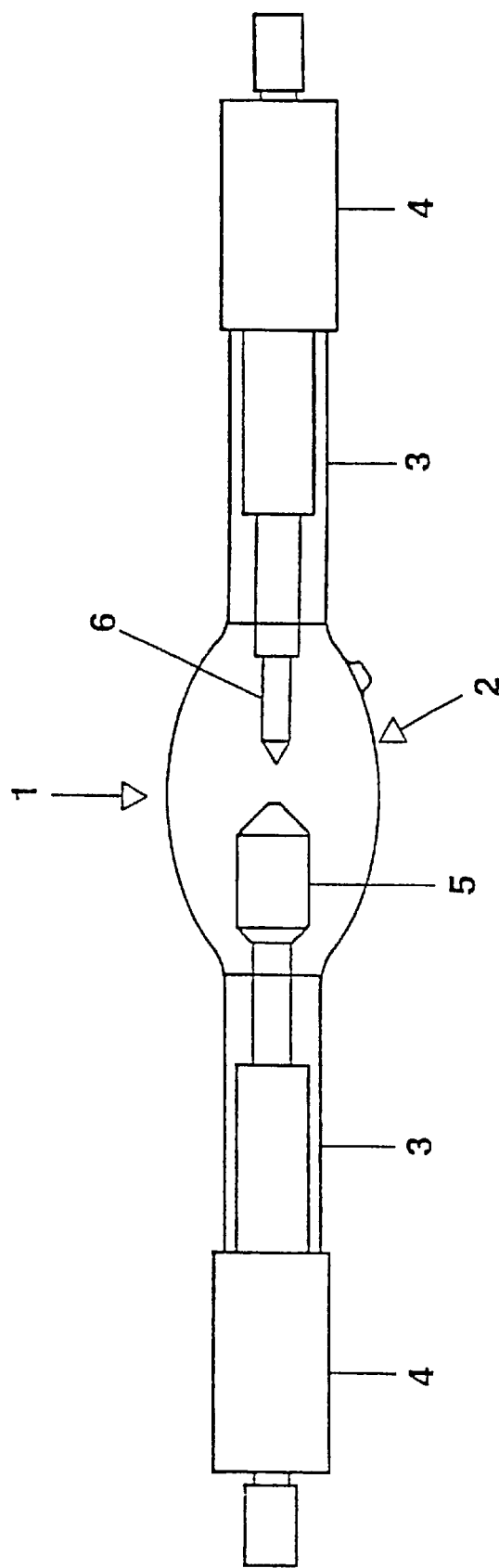
FIG. 1 shows a diagram of a mercury high-pressure discharge lamp 1 with a discharge vessel 2, two shaft sections 3 and caps 4 respectively fastened thereon. The lamp is operated with a power of 1000 W using direct current (but alternating current is also possible). The anode 5 and the cathode 6 are spaced apart by 4.5 mm. The discharge vessel 2 is made from quartz glass with a wall thickness of approximately 2.8 mm. The bulb is filled with 4.5 mg/cm³ mercury and xenon with a cold filling pressure of 1.4 bar. The operating temperature of the bulb reaches values of up to 750° C. outside.
Figure 2:
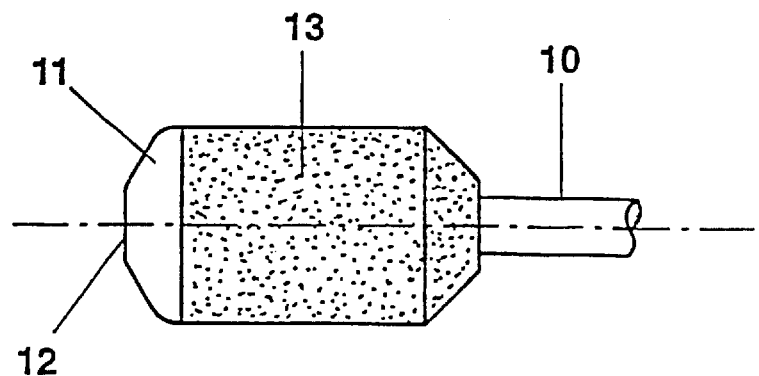
FIG. 2 shows the anode 5 in detail. The body of the anode 5 is seated in the shape of a solid cylinder on a holding rod 10. The cylinder tapers by running together conically on the side facing the discharge. The conical region 11 ends with a flat plateau 12 whose diameter is approximately 30% of the cylinder. The conical region extends over a height of approximately 6 mm. Except for its front part, which essentially comprises the conical region and the plateau, the cylinder is coated with dendritic rhenium (13). Characteristic of this are needle-shaped rhenium crystallites whose mutual spacing is approximately 10 to 30 µm. The layer thickness is approximately 25 µm. The needle-shaped crystallites are positioned virtually perpendicularly on the surface, with the result that incident radiation is virtually completely absorbed by multiple reflection between the lateral surfaces of neighbouring crystallites. As a result, such a layer has a high absorptivity and is black. According to Kirchhoff's radiation law, the high absorptivity is associated with a high emissivity. The emission coefficient of the black rhenium is approximately $\epsilon=0.9$. It is important for the function that, on the one hand, the crystallites are positioned densely enough, and on the other hand that the valley between the crystallites is deep enough. The ratio between the spacing and height of the individual dendrites should preferably be at least 0.3.
Figure 4:
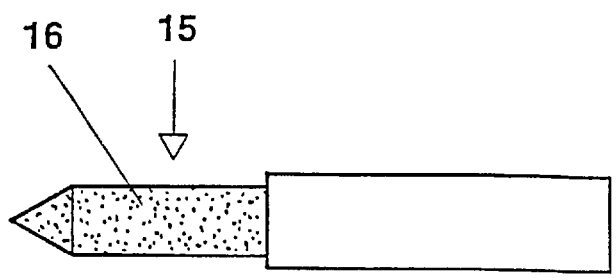
Figure 5:
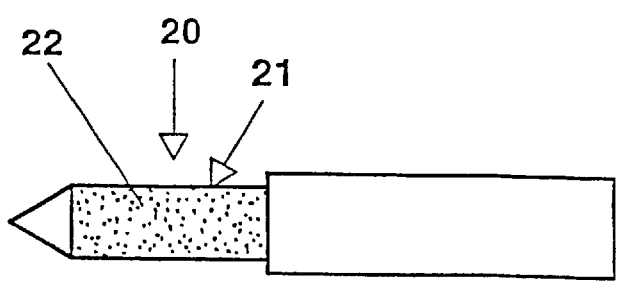

FIGS. 4 and 5 show further exemplary embodiments of a highly loaded cathode 15 for a lamp of high power (3500 W) which is covered completely with a dendritic rhenium layer 16, as well as of a less severely loaded cathode 20 for a lamp with a power of 2500 W, in which only the cylindrical body 21 is coated with rhenium 22.

Figure 6:
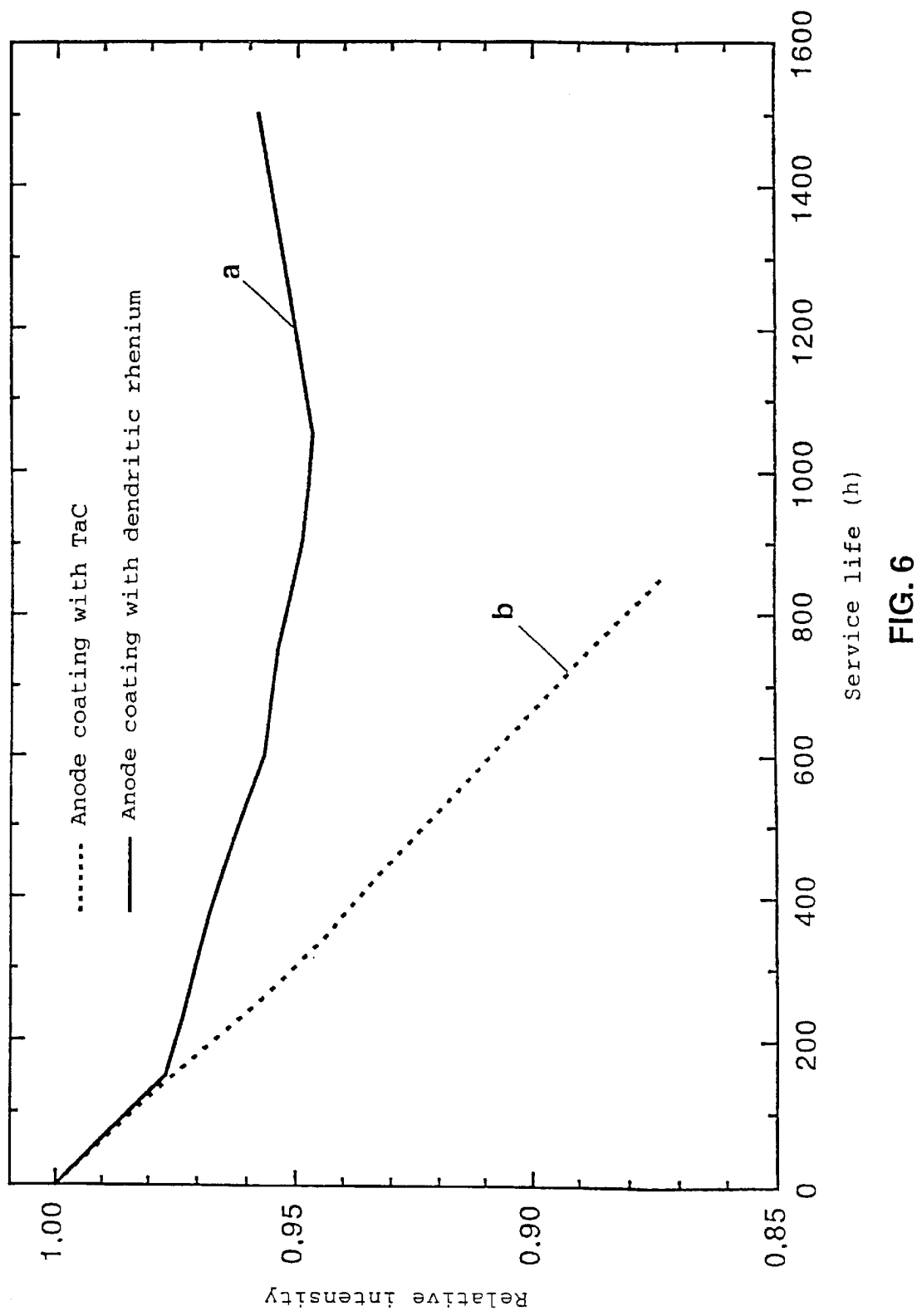

FIG. 6 shows the comparison of the decrease in radiation of a mercury short-arc lamp whose anode is coated with dendritic rhenium (curve a) in relation to a lamp of identical design whose anode is coated with TaC (curve b). The lamp was operated in each case at a constant power of 3400 W. The total radiation intensity was measured in the wavelength region of 363 to 367 nm (corresponding to the i-line particularly important for wafer steppers) using an Ulbricht sphere. It is clearly to be seen that the lamp with a dendritic anode coating has a substantially lower decrease in radiation due to blackening over the service life than the lamp with a TaC coating on the anode.

Figure 7:
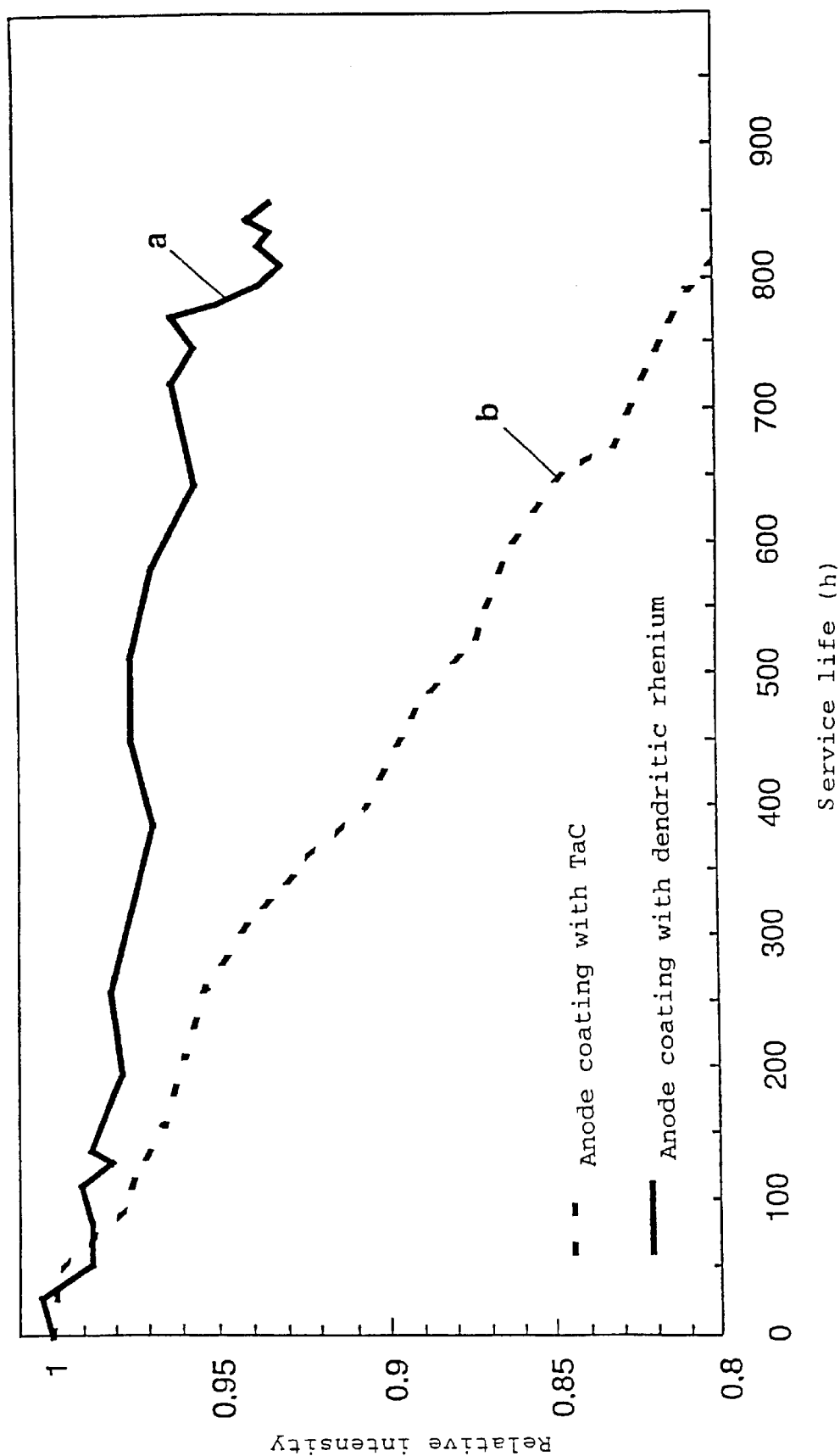
Figure 8:
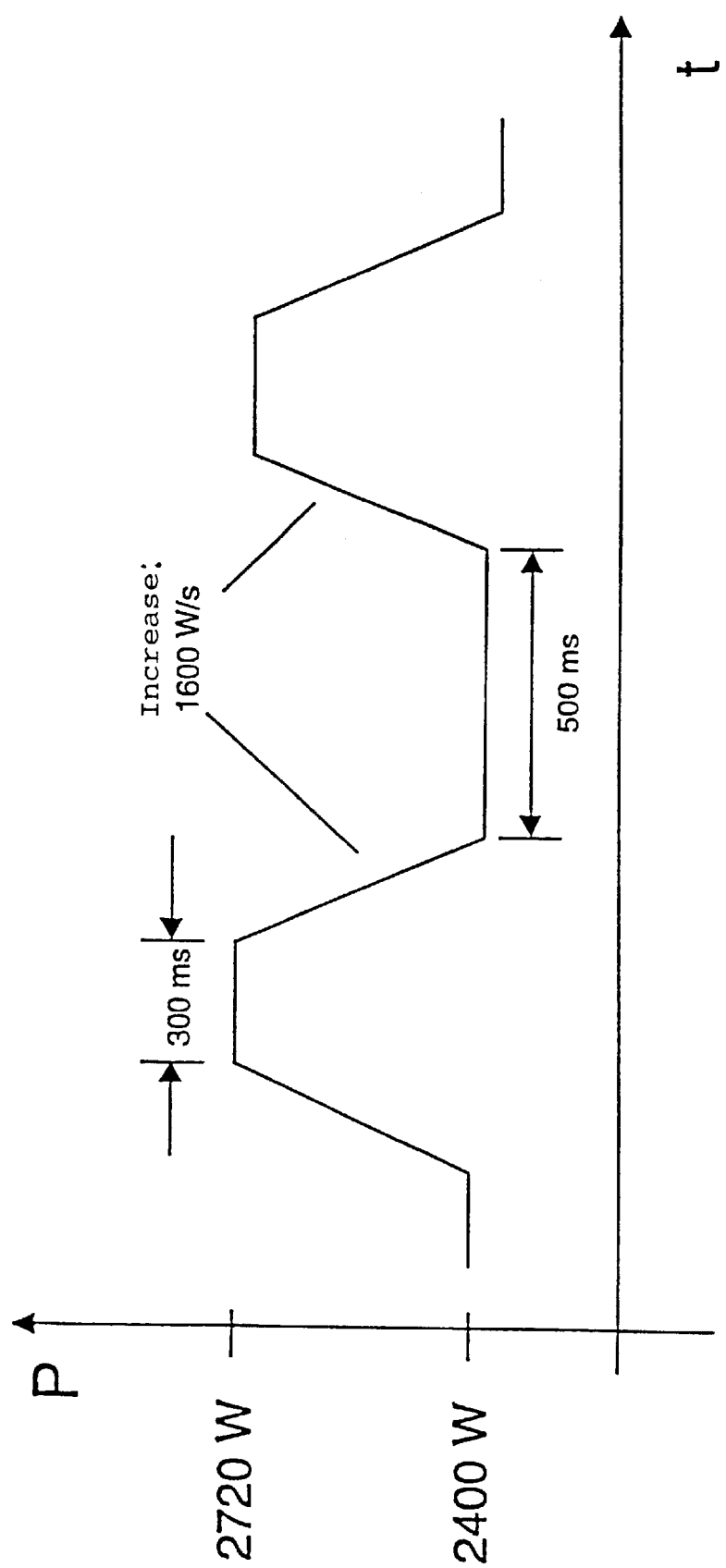

FIG. 7 shows the comparison of the decrease in radiation (once again in the region of the i-line) of a mercury short-arc lamp whose anode is coated with dendritic rhenium (curve a) in relation to a lamp of identical design (curve b) whose anode is coated with TaC, in pulsed operation. This is understood as an operation in which the power is varied periodically between at least two values, the electrodes being extremely heavily loaded. In the exemplary embodiment shown, the mercury vapour lamp is operated respectively for 300 ms at 2720 W and for 500 ms at 2400 W. The sequence of the pulses is represented diagrammatically in FIG. 8. The power is varied in each case linearly at 1600 W/s. A trapezoidally pulsed power signal results. With this power operation, the blackening of the lamps is stronger than in operation at constant power. Here, as well, the lamp with a dendritic coating of the anode exhibits a plainly better service life response (weaker blackening) than the lamp with TaC coating on the anode.

What is claimed is:

1. Electrode for a high-pressure discharge lamp comprising: a core material, at least a part of the surface of said core material being covered with a dendritic layer made from high-melting-point metal and wherein the emission coefficient of said surface is greater than 0.6.

2. Electrode according to claim 1, characterized in that the high-melting-point metal is rhenium, tungsten, molybdenum or tantalum or a mixture or a chemical compound of these metals or of the metals hafnium or zirconium, in particular a nitride or carbide.

3. Electrode according to claim 1, characterized in that the dendritic layer is between 10 and 40 $\mu$m thick.

4. Electrode according to claim 1, characterized in that the electrode is in particular a pointed cathode which is covered at least partially with the dendritic layer.

5. Electrode according to claim 1, characterized in that the electrode is an anode which is covered with the dendritic layer completely or at least partially, specifically in the region averted from the discharge.

6. Electrode according to claim 5, characteried in that the anode has a cylindrical body whose front region tapers.

7. Electrode according to claim 6, characterized in that the front region tapers conically and has a flat plateau transverse to the axis of the cylinder.

8. High-pressure discharge lamp with an electrode according to one of the preceding claims, said lamp having a fill containing mercury and/or inert gas.

9. Method for producing an electrode according to claim 1, characterized in that the deposition of the layer is performed either by means of CVD or by means of PVD.

* * * * *